(12) United States Patent
Itou

(10) Patent No.: US 6,791,156 B2
(45) Date of Patent: Sep. 14, 2004

(54) SEMICONDUCTOR DEVICE AND METHOD FOR MANUFACTURING IT

(75) Inventor: Hiroyasu Itou, Nagoya (JP)

(73) Assignee: Denso Corporation, Kariya (JP)

( * ) Notice: Subject to any disclaimer, the term of this patent is extended or adjusted under 35 U.S.C. 154(b) by 161 days.

(21) Appl. No.: 10/280,071

(22) Filed: Oct. 25, 2002

(65) Prior Publication Data

US 2003/0094708 A1 May 22, 2003

(30) Foreign Application Priority Data

Oct. 26, 2001 (JP) ........................................ 2001-329449

(51) Int. Cl.[7] .............................................. H01L 29/00
(52) U.S. Cl. ........................ 257/506; 257/532; 438/248
(58) Field of Search ................................. 257/544, 535, 257/524, 506, 501, 505, 516; 438/171, 190, 243, 248

(56) References Cited

U.S. PATENT DOCUMENTS

| | | | | | |
|---|---|---|---|---|---|
| 3,617,822 | A | * | 11/1971 | Kobayashi | 257/505 |
| 3,894,893 | A | * | 7/1975 | Kabaya et al. | 438/417 |
| 4,651,184 | A | * | 3/1987 | Malhi | 247/302 |
| 4,910,567 | A | * | 3/1990 | Malhi | 257/296 |
| 5,034,787 | A | * | 7/1991 | Dhong et al. | 257/302 |
| 5,102,817 | A | * | 4/1992 | Chatterjee et al. | 438/242 |
| 5,241,210 | A | * | 8/1993 | Nakagawa et al. | 257/487 |
| 5,397,729 | A | | 3/1995 | Kayanuma et al. | |
| 5,449,946 | A | * | 9/1995 | Sakakibara et al. | 257/487 |
| 5,612,247 | A | | 3/1997 | Itabashi | |
| 6,288,426 | B1 | * | 9/2001 | Gauthier et al. | 257/347 |
| 6,407,425 | B1 | * | 6/2002 | Babcock et al. | 257/318 |
| 6,531,754 | B1 | * | 3/2003 | Nagano et al. | 257/510 |
| 6,642,599 | B1 | * | 11/2003 | Watabe et al. | 257/509 |

FOREIGN PATENT DOCUMENTS

| JP | A-S64-18261 | 1/1989 |
|---|---|---|
| JP | A-H05-183156 | 7/1993 |
| JP | A-H07-249770 | 9/1995 |
| JP | A-H10-321801 | 12/1998 |
| JP | A-H11-8359 | 1/1999 |
| JP | A-H11-150246 | 6/1999 |
| JP | A-2000-294623 | 10/2000 |

OTHER PUBLICATIONS

Hiroyasu Ito, Yoshihiko Isobe, Shoji Mizuno and Kazunori Kawamoto, "Gate Insulator Characteristics on the bonded thick SOI Wafers for Automotive IC applications," IWGI 2001, pp. 1–4.

* cited by examiner

Primary Examiner—S. V. Clark
(74) Attorney, Agent, or Firm—Posz & Bethards, PLC

(57) ABSTRACT

In a manufacturing process of an SOI structure semiconductor device in which an MOS capacitor is located on an SOI substrate, the capacitor insulating film of the MOS capacitor is prevented from degrading due to a bimetal effect, which is caused by a thermal treatment and characteristic to the SOI substrate. A trench is formed to surround the MOS capacitor in the SOI substrate, thick oxide films are formed on sidewalls defining the trench, and the trench is filled with polysilicon to complete a trench isolation layer. Because the thick oxide films have a coefficient of thermal expansion that is different from that of a silicon semiconductor layer of the SOI substrate, the thick oxide films are able to prevent the capacitor insulating film from degrading in film quality due to the thermal treatment in the manufacturing process. As a result, an SOI semiconductor device in which an MOS capacitor on an SOI substrate offers performance comparable to an MOS capacitor on a silicon substrate can be formed.

31 Claims, 13 Drawing Sheets

SEMICONDUCTOR DEVICE AND METHOD FOR MANUFACTURING IT

CROSS REFERENCE TO RELATED APPLICATION

This application is based upon and claims the benefit of Japanese Patent Application No. 2001-329449 filed on Oct. 26, 2001, the contents of which are incorporated herein by reference.

BACKGROUND OF THE INVENTION

The present invention relates to an MOS semiconductor device in a complex semiconductor device using a silicon-on-insulator (SOI) substrate and a method for manufacturing it. More particularly, the present invention relates to a semiconductor device that offers improved characteristics in an insulating layer between electrodes in an MOS capacitor and a method of manufacturing it.

In recent years, SOI substrates have come to be widely used for semiconductor devices that include a multitude of devices of several different types on a semiconductor substrate. Because an area that includes the semiconductor devices and the semiconductor substrate are separated by an oxide film, which is a buried insulating film, in a semiconductor device having an SOI structure manufactured using an SOI substrate, an SOI semiconductor device offers superior electrical characteristics. It has been reported on many occasions, however, that a quality of an insulating film in an MOS semiconductor device formed on an SOI substrate is inferior to an insulating film formed on a regular silicon substrate.

An MOS capacitor 1, having a cross-sectional structure shown in FIG. 14, is an example of an MOS capacitor formed on an SOI substrate. The MOS capacitor 1 includes a support substrate 2, an oxide film 3 on the support substrate 2, and a silicon layer 4 on the oxide film 3. On a surface of the silicon layer 4 on an SOI substrate 5 are a diffusion layer 6, which functions as one of a pair of capacitor electrodes; LOCOS 7; and a capacitor thermal oxide film 8 which functions as a capacitor insulating film. A capacitor upper electrode 9, which functions as the other capacitor electrode, is on top of the capacitor thermal oxide film 8.

As shown in FIG. 15, compared with MOS capacitors formed using silicon substrates with an identical manufacturing method, MOS capacitors on the SOI substrates 5 show a higher rate of mode B failures, which are infant mortality failures caused by the capacitor thermal oxide film 8 breaking down at a lower voltage level than a true breakdown voltage.

The causes for a high rate of mode B failures for the MOS capacitors 1 on the SOI substrates 5 will be described next.

On the SOI substrate 5, the oxide film 3, having a different coefficient of thermal expansion than the silicon substrate 2, is on the silicon substrate 2, and the silicon semiconductor layer 4 is on the oxide film 3. When the SOI substrate 5 goes through a thermal treatment in a process of manufacturing the MOS capacitor 1, the quality of the capacitor thermal oxide film 8 is adversely affected, and a bimetal effect, characteristic to the SOI substrate 5, is created.

Because of the bimetal effect in the SOI substrate 5, the diffusion layer 6 and the capacitor thermal oxide film 8 on the diffusion layer 6 seem to behave differently from corresponding parts would on a regular silicon substrate.

Another example of a capacitor insulating film that may be used for an MOS capacitor on a silicon substrate is an oxide nitride oxide (ONO) film, which is a multilayer film that includes silicon oxide films and a silicon nitride film. The ONO film includes three layers of a silicon oxide film, a silicon nitride film, and another silicon oxide film, and the silicon nitride film is sandwiched between the two silicon oxide films.

As shown in FIG. 16, the rate of mode B failures goes down, when an ONO film is used, instead of the capacitor thermal oxide film 8, in the MOS capacitor, compared with the failure rate shown in FIG. 14. However, as shown in FIG. 17, there is a high rate of time-dependent random failures. FIG. 17 shows failure rates over time of device operation, measured using a constant voltage time-dependent dielectric breakdown (TDDB) method. For this reason, the yields of the SOI semiconductor devices, having the MOS capacitor 1 on the SOI substrate 5, cannot be improve simply by using the ONO film for the capacitor insulating film in the MOS capacitor 1 formed on the SOI substrate 5.

SUMMARY OF THE INVENTION

The present invention addresses the issue described above by, firstly, reducing the rates of mode B failures, believed to be caused by the bimetal effect in an SOI substrate resulting from a thermal treatment of an MOS device formed on the SOI substrate. Secondly, the present invention lengthens the relative time to TDDB failures, while reducing the rates of mode B failures by improving the dielectric breakdown voltage, in the MOS devices formed on the SOI substrates in SOI semiconductor devices.

The SOI semiconductor device that achieves the first objective includes an SOI substrate, an MOS capacitor, and a trench isolation layer. The SOI substrate includes a supporting substrate, a buried oxide film, and a silicon semiconductor layer. The MOS capacitor includes a buried layer that functions as one of the capacitor electrodes and is located in the silicon semiconductor layer; a capacitor insulating layer on top of the buried layer; and an upper layer electrode that functions as the other capacitor electrode and is located on top of the capacitor insulating film. The trench isolation layer surrounds the MOS capacitor in order to insulate and isolate the MOS capacitor. The trench isolation layer has a coefficient of thermal expansion that is different from the silicon semiconductor layer.

The trench isolation layer alleviates the bimetal effect that is characteristic to the SOI substrate. For this reason, the trench isolation layer effectively prevents film quality from degrading in the gate insulating film, especially in the MOS capacitor for buffering against surges, which would be large in both capacitance and size.

By the way, each MOS capacitor should preferably be isolated individually by a trench isolation layer in an SOI semiconductor device structure that includes a multitude of MOS capacitors. If the capacitors are small in capacitance and size, however, the multitude of MOS capacitors may be placed in a single isolated area surrounded by a single trench isolation layer.

An SOI semiconductor device that achieves the second objective includes an SOI substrate, which includes a supporting substrate, a buried oxide film, and a silicon semiconductor layer; and an MOS capacitor, which includes a buried layer located in the silicon semiconductor layer and functions as one of the capacitor electrodes; a capacitor insulating layer on the buried layer; and an upper layer electrode which is on top of the capacitor insulating layer and functions as the other capacitor electrode. The capacitor insulating film in the MOS capacitor is an ONO film, which includes a lower layer oxide film in contact with the buried layer; a silicon nitride film on the lower layer oxide film; and an upper layer oxide film on top of the silicon nitride film. The lower layer oxide film is less than or equal to 50 nm in thickness.

By making the lower layer oxide film, which tends to be affected by surface defects on the semiconductor surface, thin in the ONO film, a capacitor insulating film that offers a relatively higher breakdown voltage and longer mean time to TDDB failure may be formed on the SOI substrate.

As long as the film thickness of the lower layer oxide film in the ONO film is less than or equal to 50 nm and greater than or equal to 25 nm, capacitance of the MOS capacitor that uses the ONO film would be uniform and show stable characteristics. If the lower layer oxide film in the ONO film were extremely thin, capacitance of the MOS capacitor would become non-uniform due to conditions at the silicon/oxide film interface.

When the silicon nitride film in the ONO film is greater than or equal to 40 nm in thickness, the resulting capacitor insulating film would offer an even higher breakdown voltage and longer mean time to TDDB failure on the SOI substrate.

When the silicon semiconductor layer is greater than or equal to 10 μm in thickness, the SOI substrate is more susceptible to the bimetal effect. Therefore, the present invention offers an SOI semiconductor device with a highly reliable MOS capacitor when the thickness of the silicon semiconductor layer is greater than or equal to 10 μm.

Capacitance of the MOS capacitor becomes less dependent on voltage when the surface impurity concentration level in the buried layer is greater than or equal to 1E18 atoms/cm$^3$.

When the SOI semiconductor device includes the MOS capacitor and another type of MOS device, the upper layer oxide film in the ONO film may be formed simultaneously with a gate insulating film for an MOS device. As a result, the number of manufacturing steps can be reduced for cost reduction.

BRIEF DESCRIPTION OF THE DRAWINGS

Other objects and features of the present invention will become more readily apparent from a better understanding of the preferred embodiments described below with reference to the following drawings, in the drawings.

DETAILED DESCRIPTION OF THE PREFERRED EMBODIMENT

First Embodiment

Figure 1A:
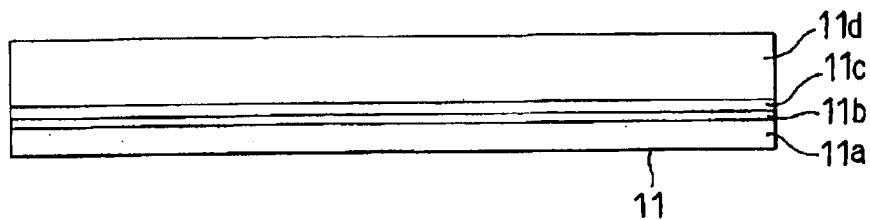
FIG. 1A through FIG. 1I are schematic cross-sectional diagrams representing each step in a manufacturing process for the SOI semiconductor device of the first embodiment of the present invention.
Figure 1B:
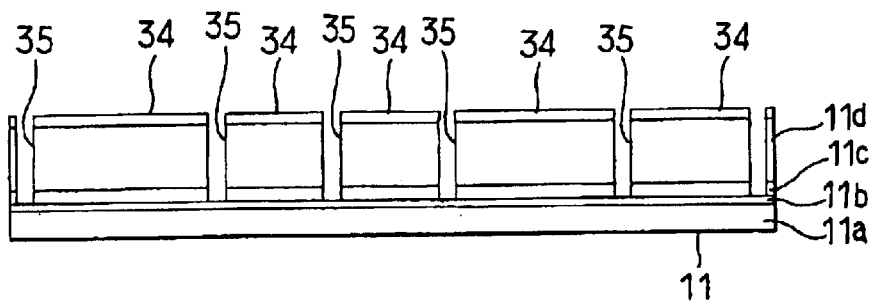
Figure 1C:
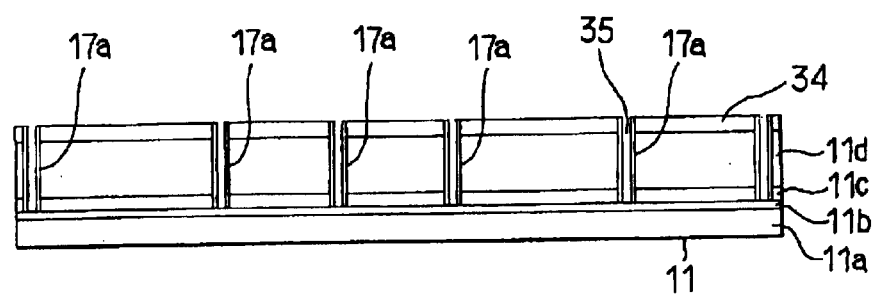
Figure 1D:
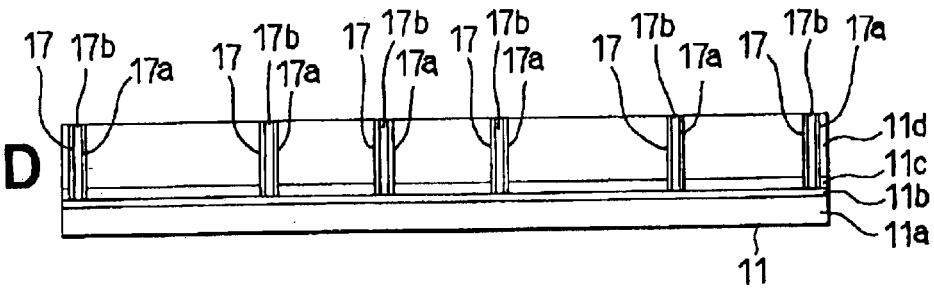
Figure 1E:
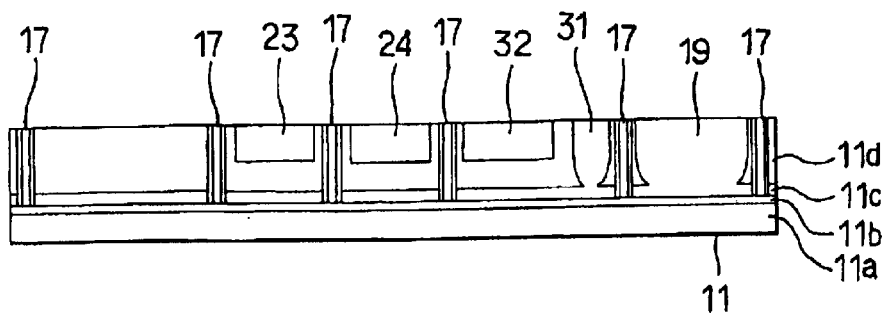
Figure 1F:
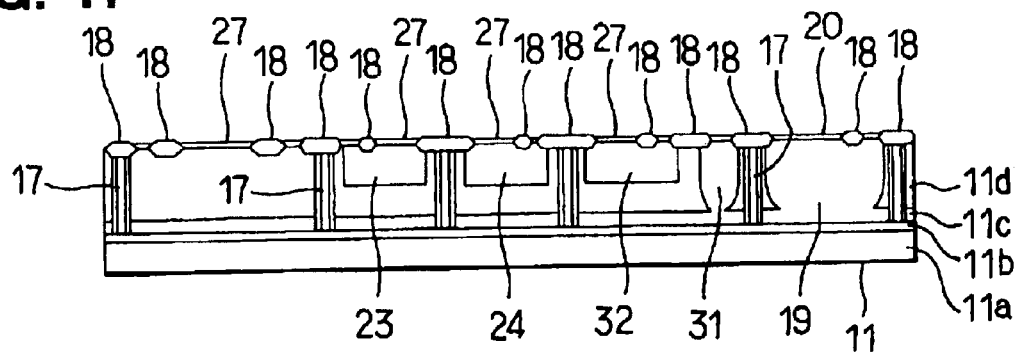
Figure 1G:
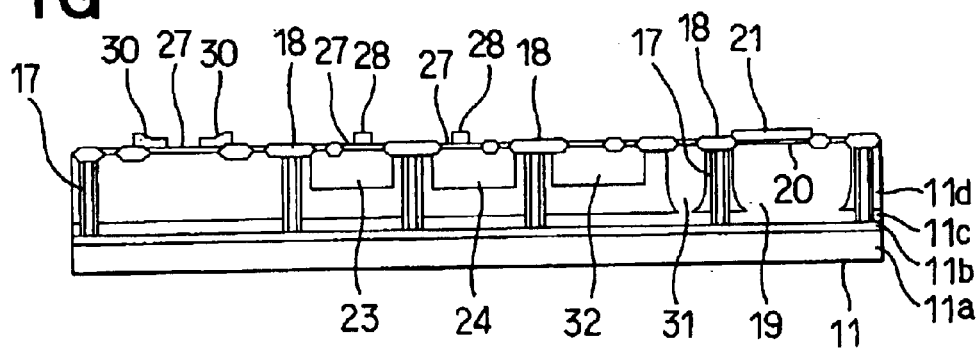
Figure 1H:
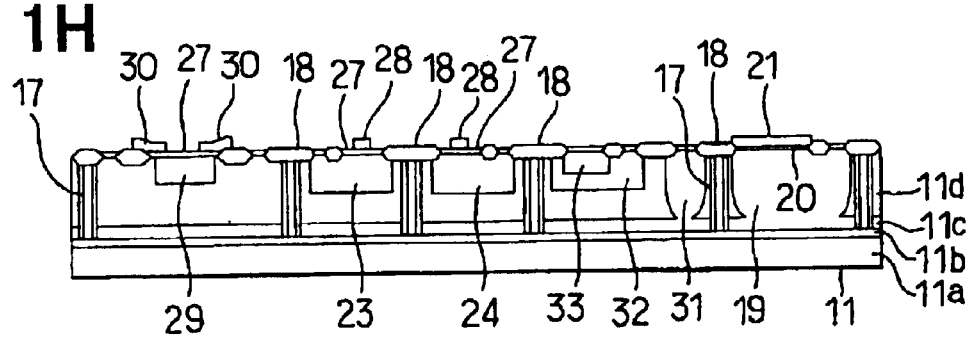
Figure 1I:
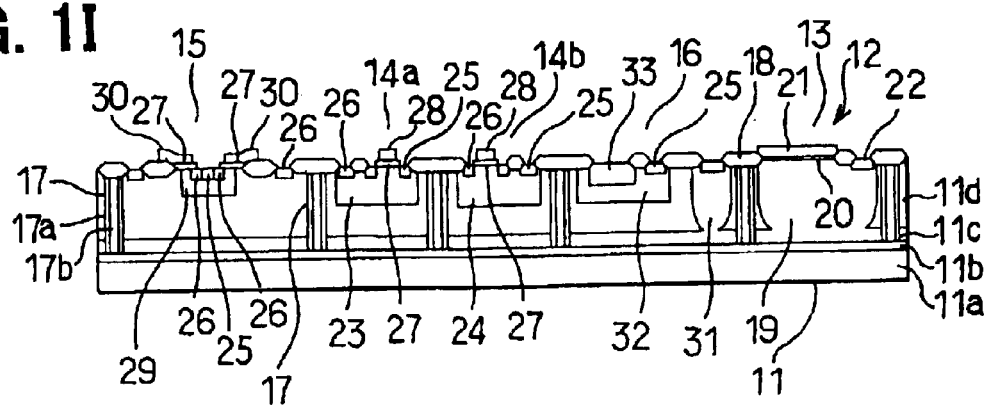

As shown in FIG. 1I, an SOI semiconductor device 12 that includes an SOI substrate 11 includes an MOS capacitor 13, which is an MOS device, CMOS devices 14a, 14b, a lateral diffused MOS (LDMOS) device 15, and a bipolar transistor 16.

The SOI substrate 11 includes a silicon support substrate 11a; a buried oxide film 11b, the film thickness of which is, for example, approximately 1.3 μm; and single crystal silicon semiconductor layers 11c, 11d of a first conductance type. The buried oxide film 11b is sandwiched between the silicon support substrate 11a and the single crystal silicon semiconductor layer 11c of the first conductance type. Impurity concentration level in the silicon semiconductor layer 11c is higher than the impurity concentration level in the silicon semiconductor layer 11d. A combined film thickness for the silicon semiconductor layers 11c, 11d is, for example, approximately 16 μm.

Each of the MOS capacitor 13, the CMOS device 14a, the CMOS device 14b, the LDMOS device 15, and the bipolar transistor 16 is electrically insulated from each other by being surrounded by trench isolation layers 17. The trench isolation layers 17 are in the trenches formed in the semiconductor layers 11c, 11d. Each of the trench isolation layers 17 includes oxide films 17a, which are formed on the trench sidewalls, and a polysilicon layer 17b between the oxide films 17a. LOCOS 18 are at predetermined positions at the surface in the area that includes the MOS capacitor 13, the CMOS DEVICE 14a, the CMOS device 14b, the LDMOS device 15, and the bipolar transistor 16 in order to electrically isolate these devices.

As shown in FIG. 1I, a buried first conductance type layer 19, which functions as one of capacitor electrodes in the MOS capacitor 13, is in the silicon semiconductor layer 11d. On top of the buried first conductance type layer 19 is a capacitor thermal oxide film 20, which functions as a capacitor insulating layer. On top of the capacitor thermal oxide film 20 is an upper layer electrode 21, which include a polysilicon film and functions as the other capacitor electrode. Furthermore, a first conductance type high impurity concentration area 22 is at the surface of the buried first conductance type layer 19 for establishing an electrical contact between the buried first conductance type layer 19 and wiring lines.

In the CMOS devices 14a, 14b, a first conductance type well 23 and a second conductance type well 24, respectively, are located at a surface of the silicon semiconductor layer 11d. At a surface of each of the wells 23, 24 are a high impurity second conductance type layer 25 and a high impurity first conductance type layer 26, which function as source and drain areas. A gate insulating film 27 is at surfaces of areas for forming channels between the high impurity second conductance type layer 25 and the high impurity first conductance type layer 26. On top of the gate insulating film 27 are gate electrodes 28.

In the LDMOS device 15, a second conductance type channel layer 29 is at a surface of the silicon semiconductor layer 11d. At a surface of the second conductance type channel layer 29 are a high impurity first conductance type layer 26, which functions as a source area, and a high impurity second conductance type layer 25, which functions as a channel contact area. The gate insulating film 27 is at a surface of the channel area in the LDMOS device 50, and a gate electrode 30 is on top of the gate insulating film 27.

In the bipolar transistor 16, a high impurity first conductance type sink layer 31 is in the silicon semiconductor layer 1id. The high impurity first conductance type sink layer 31 is connected to the silicon semiconductor layer 11c. At a surface of the silicon semiconductor layer 1id is a second conductance type base area 32. On a surface of the base area 32 is a first conductance type emitter area 33.

A manufacturing process for the SOI semiconductor device 12 in FIG. 1I will be described next. As shown in FIG. 1A, an SOI substrate 11, which includes a silicon support substrate 11a, a thick buried oxide film 11b, and single crystal silicon semiconductor layers 11c, 11d of the first conductance type, is prepared. Next, a mask material 34 for forming trenches 35 is formed to cover the area for forming MOS devices on the silicon semiconductor layer 11d on the SOI substrate 11. Then, as shown in FIG. 1B, the mask material 34 is used as an etching mask for dry etching to form the trenches 35 for trench isolation layers 17. Next, a step such as annealing, sacrificial oxidation, and wet etching, or a combination of such steps is performed for removing a layer of etch damages, which has resulted from dry etching.

Next, as shown in FIG. 1C, thick oxide films 17a are formed on sidewalls of the trenches 35 such that the combined film thickness of the oxide films 17a is greater than or equal to one third of the width of the trench 35. After the oxide films 17a are formed, the remaining spaces in the trenches 35 are filled using a polysilicon 17b. Next, as shown in FIG. 1D, the mask material 34 is stripped off, and the substrate surface is planarized for completing the trench isolation layers 17, which have a coefficient of thermal expansion that is different from those of the silicon semiconductor layers 11c, 11d. After the trench isolation layers 17 are formed, a buried first conductance type layer 19, which functions as one of the capacitor electrodes for the MOS capacitor 13, and a high impurity first conductance type sink layer 31 are formed. Next, as shown in FIG. 1E, a first conductance type well 23 and a second conductance type well 24 for a CMOS device 14a and a CMOS device 14b, respectively, as well as a base area 32 of the second conductance type for a bipolar transistor 16, are formed.

Then, LOCOS 18 are formed at predetermined positions on the surface of the SOI substrate 11 for fine-geometry device isolation. After a sacrificial oxidation that follows, a capacitor thermal oxide film 20, which functions as the capacitor insulating layer, and a gate insulating layer 27 are formed by thermal oxidation as shown in FIG. 1F. Sacrificial oxidation is used as a treatment for creating a high quality surface for forming the devices. Next, as shown in FIG. 1G, a polysilicon film is formed on the surfaces of the capacitor thermal oxide film 20 and the gate insulating film 27 and patterned into an upper electrode 21 for the MOS capacitor 13, gate electrodes 28 for the CMOS devices 14a, 14b, and a gate electrode 30 for an LDMOS device 15.

After the electrodes 21, 28, 30, including polysilicon, are formed, a first conductance type emitter area 33 of the bipolar transistor 16 and a second conductance type channel layer 29 of the LDMOS device 15 are formed by implanting and thermal treatment, as shown in FIG. 1H. Then, as shown in FIG. 1I, a second conductance type high impurity layer 25 and a first conductance type high impurity layer 26 are formed. Then, although not shown in the figures, a thick insulating layer is formed, and contact holes are opened through the insulating layer. Finally, metal wire lines are formed to complete the SOI semiconductor device 12, which includes the MOS capacitor 13, the CMOS devices 14a, 14b, the LDMOS device 15, and the bipolar transistor 16 on the SOI substrate 11.

Second Embodiment

Figure 2A:
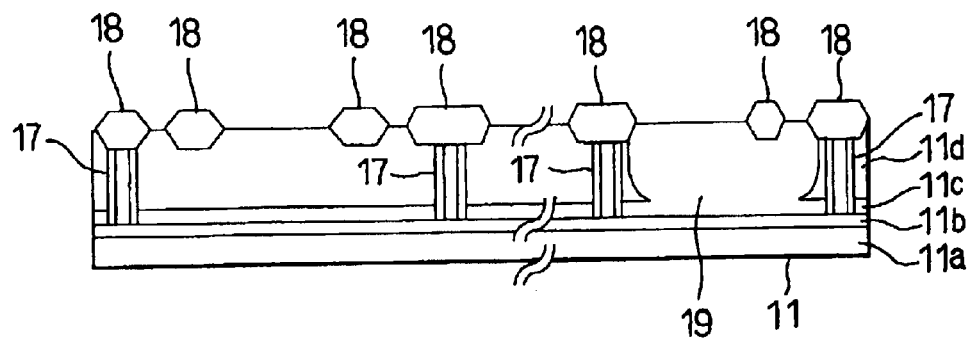
FIG. 2A through FIG. 2F are schematic cross-sectional diagrams corresponding to each step in the manufacturing process for the SOI semiconductor device of the second embodiment of the present invention.
Figure 2B:
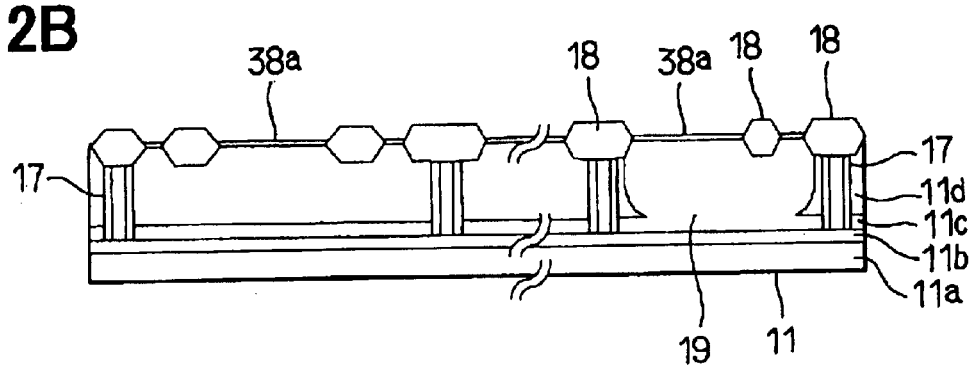
Figure 2C:
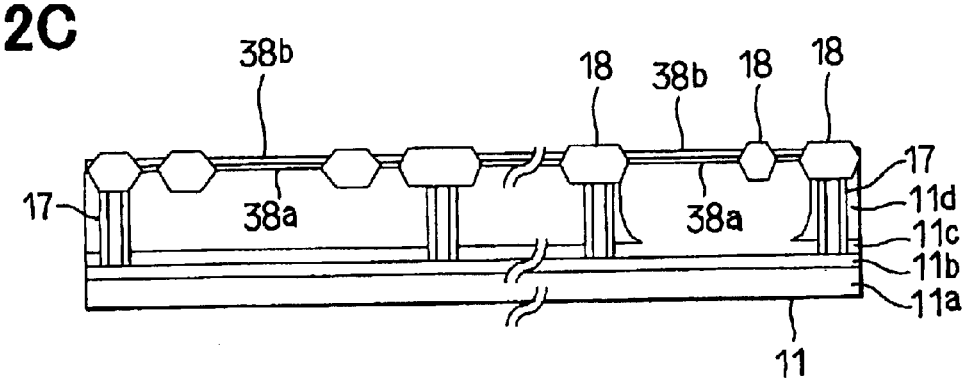
Figure 2D:
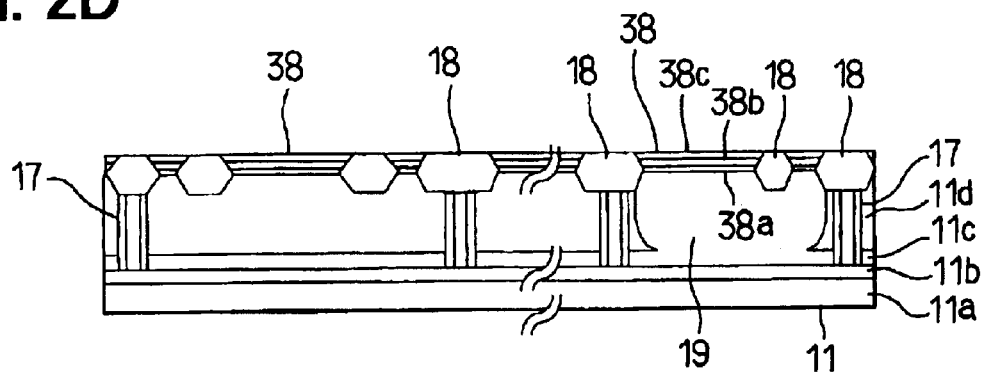
Figure 2E:
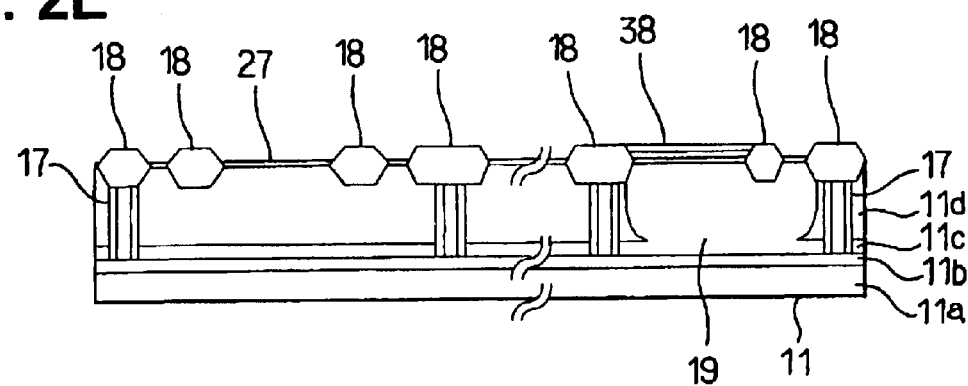
Figure 2F:
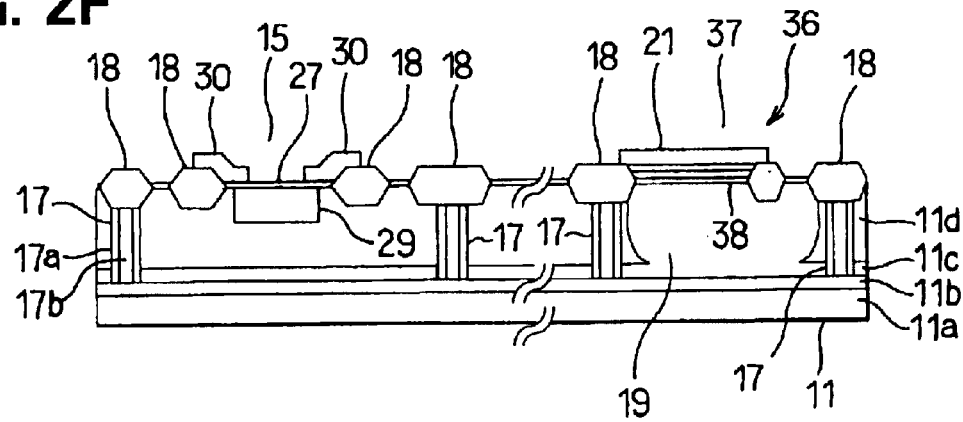

As shown in FIG. 2F, an SOI semiconductor device 36 using an SOI substrate 11 differs from the SOI semiconductor device 12 in FIG. 1I in that an ONO film 38 is used as a capacitor insulating film for an MOS capacitor 37. Although the SOI semiconductor device 36 includes the same CMOS devices 14a, 14b and the bipolar transistor 16 as the CMOS devices 14a, 14b and bipolar transistor 16 in the SOI semiconductor device 12 in FIG. 1I, FIG. 2F does not show the CMOS devices 14a, 14b and the bipolar transistor 16.

As shown in FIG. 2F, the ONO film 38 includes a lower layer oxide film 38a, a silicon nitride film 38b, and an upper layer oxide film 38c. The silicon nitride film 38b is sandwiched between the lower layer oxide film 38a and the upper layer oxide film 38c. The lower layer oxide film 38a is less than or equal to 50 nm in thickness. The thickness of the lower layer oxide film 38a should preferably be greater than or equal to 25 nm and less than or equal to 40 nm. Even more preferably, the film thickness should be greater than or equal to 25 nm and less than or equal to 35 nm. The thickness of the silicon nitride film 38b is greater than or equal to 40 nm. The thickness of the silicon nitride film 38b should preferably be greater than or equal to 50 nm.

By the way, a buried first conductance type layer 19, which is on a silicon semiconductor layer 1id and functions as one of the capacitor electrodes for the MOS capacitor 37, has an impurity concentration level of greater than or equal to 1E18 atoms/cm$^3$ in order to, as it will be described later, make the capacitor electrode capacitance less dependent on voltage.

A manufacturing process for the SOI semiconductor device 36 in FIG. 2F will be described next. A step shown in FIG. 2A follows a step shown in FIG. 1E in the process of manufacturing the SOI semiconductor device 12 in FIG. 1I. As shown in FIG. 2A, LOCOS 18 are formed at predetermined locations on a surface of an SOI substrate 11. Then, a sacrificial oxidation treatment is used for creating a high quality surface for forming the devices. Then, as shown in FIG. 2B, a lower layer oxide film 38a of an ONO film 38 is formed by thermal oxidation. As mentioned earlier, the thickness of the lower layer oxide film 38a is less than or equal to 50 nm. The thickness of the lower layer oxide film 38a should preferably be greater than or equal to 25 nm and less than or equal to 40 nm. Even more preferably, the film thickness should be greater than or equal to 25 nm and less than or equal to 35 nm.

Then, as shown in FIG. 2C, a silicon nitride film 38b, the film thickness of which is greater than or equal to 40 nm, is deposited by an LPCVD method. The film thickness of the silicon nitride film 38b, as mentioned earlier, should preferably be greater than or equal to 50 nm. Next, as shown in FIG. 2D, an upper layer oxide film 38c is formed by thermal oxidation. Then, the ONO film is stripped off, except in an area corresponding to an MOS capacitor 37. Next, as shown in FIG. 2E, a gate insulating film 27 for other MOS devices like an LDMOS device 15 is formed by thermal oxidation.

Then, as shown in FIG. 2F, a polysilicon film is deposited and processed to form an upper electrode 21 for the MOS capacitor 37 and a gate electrode 30 for the LDMOS device 15. Then, while not shown in the diagrams, other diffusion layers, required for forming the various semiconductor devices included in the SOI semiconductor device 36 in FIG. 2F, are formed. A thick insulating film is deposited, and contact holes are opened through the thick insulating film. Finally, metal wiring lines are formed to complete the manufacturing of the SOI semiconductor device 36 that includes the MOS capacitor 37, which is on the SOI substrate 11 and offers a relatively high breakdown voltage and a long enough mean time to TDDB failure, which is determined by random failures.

Figure 3D:
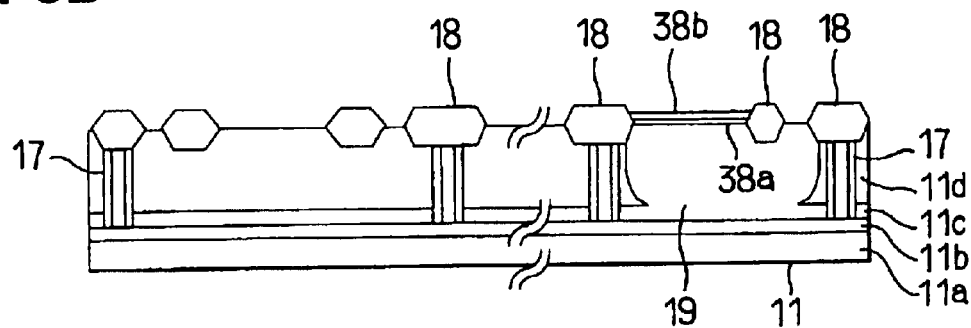
FIG. 3D through FIG. 3F are schematic cross-sectional diagrams representing each step in another manufacturing process for the SOI semiconductor device of the second embodiment.
Figure 3E:
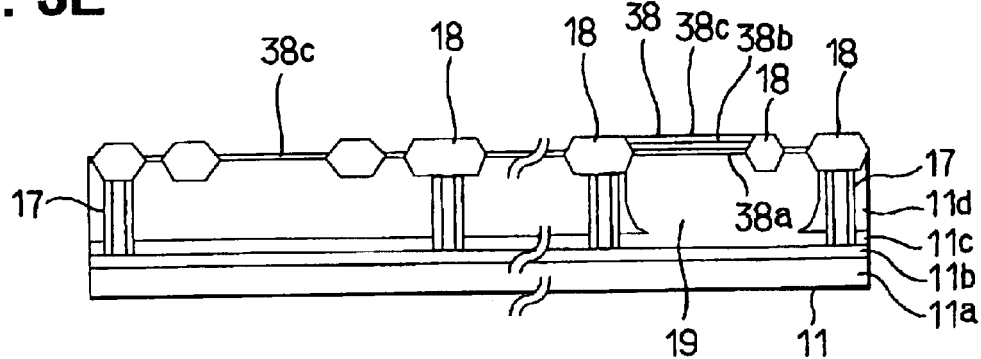
Figure 3F:
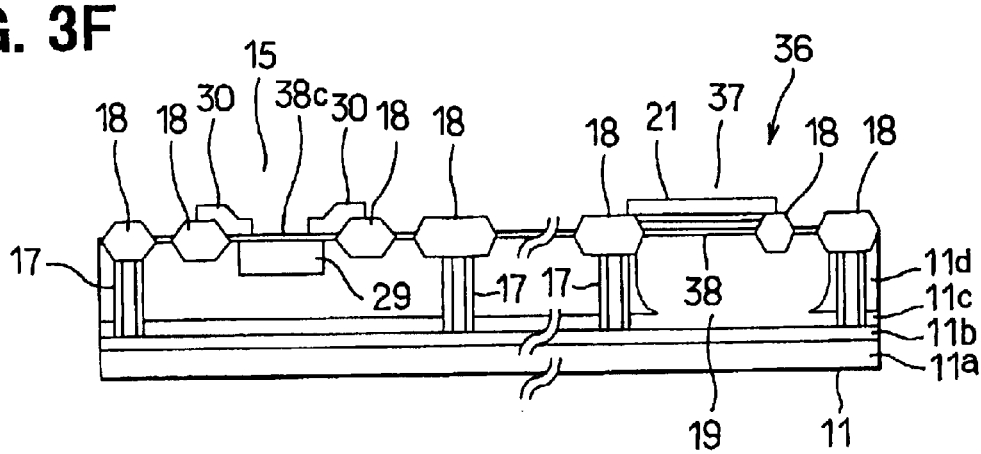

Although the SOI semiconductor device 36 in FIG. 3F has the same structure as the SOI semiconductor device 36 in FIG. 2F, the SOI semiconductor device 36 in FIG. 3F differs from the SOI semiconductor device 36 in FIG. 2F in a method used for forming the ONO film 38. While the gate insulating films 27 for the LDMOS device 15 and other MOS devices are formed separately, after the upper layer oxide film 38c in the ONO film 38 is formed in the manufacturing process for the SOI semiconductor device 36 in FIG. 2F, an upper layer oxide film 38c and a gate insulating film 27 for the LDMOS device 15 and other MOS devices are formed simultaneously in a manufacturing process for the SOI semiconductor device 36 in FIG. 3F.

A step shown in FIG. 3D follows the step shown in FIG. 2C in the manufacturing process for the SOI semiconductor device 36 in FIG. 2F. As shown in FIG. 3D, a lower layer oxide film 38a and a nitride film 38b are stripped off except in an area corresponding to an MOS capacitor 37.

Then, as shown in FIG. 3E, the upper layer oxide film 38c in the ONO film 38 and the gate insulating film 27 for the LDMOS device 15 are simultaneously formed by thermal oxidation. For this reason, the manufacturing process for the SOI semiconductor device 36 in FIG. 3F is simpler compared with the manufacturing process for the SOI semiconductor device 36 in FIG. 2F.

The characteristics of the SOI semiconductor device 12 in FIG. 1I and the SOI semiconductor device 36 in FIG. 2F will be described and compared next against the characteristics of the conventional SOI semiconductor device.

The quality of both the capacitor thermal oxide film 20 in the MOS capacitor 13 in the SOI semiconductor device 12 in FIG. 1I and the ONO film 38 in the MOS capacitor 37 in the SOI semiconductor device 36 in FIG. 2F can become degraded as a result of the bimetal effect characteristic to the SOI substrate 11, which is caused by a thermal treatment used in the manufacturing process. An MOS capacitor used as a buffer against surges is especially susceptible to the bimetal effect because of a relatively large capacitance and a large size, at more than 1 mm$^2$. For this reason, it is especially important to prevent the film quality from degrading in the capacitor insulating film in the large MOS capacitor of a relatively large capacitance. Furthermore, when another MOS device, such as the LDMOS device 15, is formed in the same SOI semiconductor device, the capacitor insulating films 20, 38 can be even more susceptible to the bimetal effect characteristic to the SOI substrate 11 because of repeated thermal treatment steps at high temperature, which are used for forming, for example, diffusion layers after the capacitor insulating films 20, 38 have been formed.

In order to study a degradation in quality of the gate insulating film, caused by the bimetal effect characteristic to the SOI substrate 11, the MOS capacitor on the SOI substrate (SOI substrate MOS capacitor), that includes the thermal oxide film 4 as the capacitor insulating film, has been characterized. In addition, the MOS capacitor on the regular silicon substrate (silicon substrate MOS capacitor), which includes the thermal oxide film as the capacitor insulating film, has also been characterized.

The diffusion areas that function as one of the capacitor electrodes in these MOS capacitors have a surface impurity concentration level of 1E19 atoms/cm$^3$. Furthermore, the size of these MOS capacitors is 1.00 mm$^2$. A large number of MOS capacitor samples was created, and the breakdown voltage levels for the MOS capacitor samples were measured to obtain distributions.

Figure 4A:
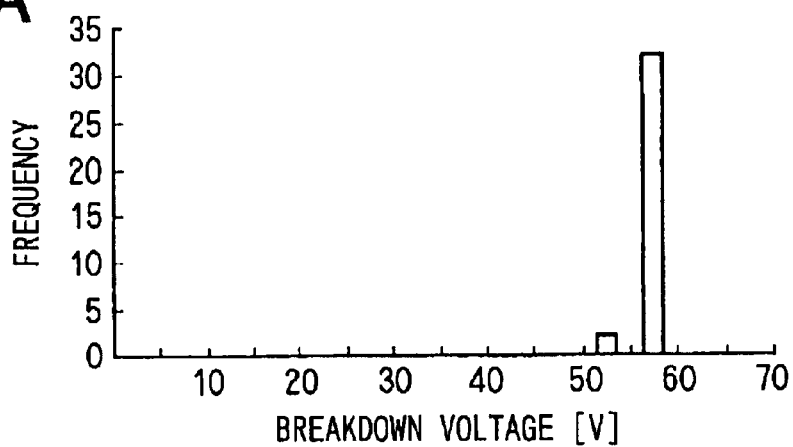
FIG. 4A shows a distribution of the breakdown voltage levels for MOS capacitors on silicon substrates.
Figure 4B:
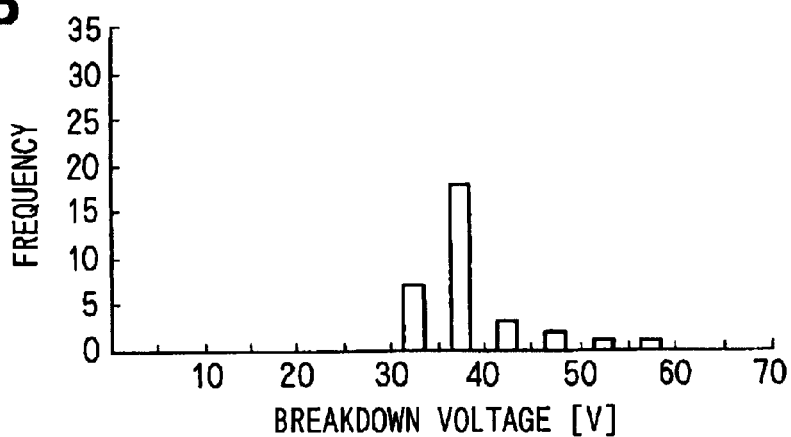
FIG. 4B shows a distribution of the breakdown voltage levels for MOS capacitors on SOI substrates that do not include a trench isolation layer.

As shown in FIG. 4A and FIG. 4B, the distribution of the breakdown voltage levels of the capacitor insulating films in the SOI substrate MOS capacitors is at a lower level than the distribution of the breakdown voltage levels of the capacitor insulating films in the silicon substrate MOS capacitors, because of the bimetal effect characteristic to the SOI substrate, even though the MOS capacitors have the same structure and have been formed using the same manufacturing process. For this reason, the SOI substrate MOS capacitor shows a higher rate of mode B failures than the silicon substrate MOS capacitors. A high incidence of mode B failures is observed, when the surface impurity concentration level in the diffusion area, which functions as one of the capacitor electrodes, is raised to as high level as 1E18 atmoms/cm$^3$ in order to make the capacitance of the SOI substrate MOS capacitor less dependent on voltage.

On the other hand, in the manufacturing process for the SOI semiconductor device 12 in FIG. 1I, the trench isolation layers 17, having a coefficient of thermal expansion that is different from those of the silicon semiconductor layers 11c, 11d, are formed before the MOS capacitor 13 is formed on the SOI substrate. In the manufacturing process for the SOI semiconductor device 12 in FIG. 1I, the trenches 35 have a width of, for example, 2 μm. Then, each sidewall of the trenches 35 is covered with a thick oxide film 17a, the film thickness of which is approximately 0.5 μm, so that the combined film thickness of the oxide film 17a on both sidewalls would be 1 μm. Then, the remaining space in the trenches 35 are filled with the polysilicon 17b, and the trench isolation layers 17 are completed. Therefore, the thick oxide films 17a occupy more than one third of the 2 μm width in each of the trenches 35.

Figure 4C:
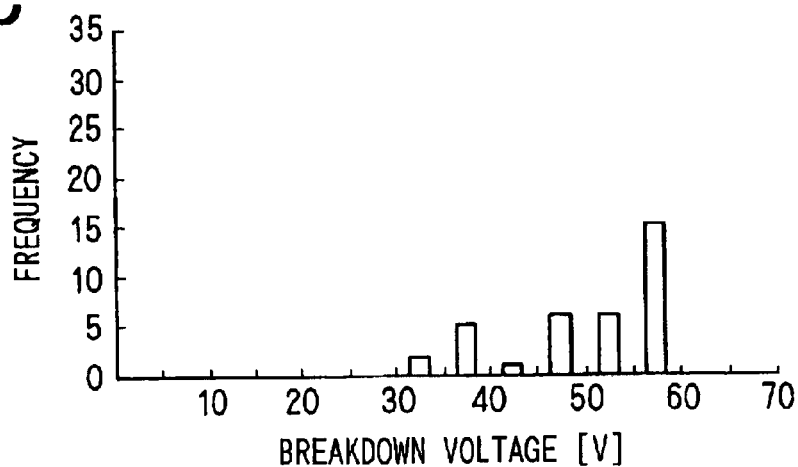
FIG. 4C shows a distribution of the breakdown voltage levels for MOS capacitors on SOI substrates with a trench isolation layer.

The MOS capacitor, which is on the SOI substrate and includes the capacitor insulating film, including a thermal oxide film, and surrounded by a trench isolation layer of the same structure as the trench isolation layer 17 in FIG. 1I, (trench isolation layer SOI substrate MOS capacitor) has been characterized. As shown in FIG. 4C, a distribution of the breakdown voltage levels of the capacitor insulating films in the trench isolation layer SOI substrate MOS capacitors is at a higher level than the SOI substrate MOS capacitors.

Because the bimetal effect characteristic of the SOI substrate 11 is alleviated by the trench isolation layer 17, the quality of the oxide film on the surface of the silicon semiconductor layer 1id does not get degraded as a result of the bimetal effect. As a result, the rate of mode B failures, caused by breakdowns at lower voltage levels, is much lower with the SOI semiconductor device 12 shown in FIG. 1I.

By the way, when a multitude of MOS capacitors is integrated on the SOI semiconductor device, each MOS capacitor should preferably be surrounded by a trench isolation layer. If the MOS capacitors are small in both capacitance and size, then the multitude of MOS capacitors may be placed in a single area surrounded by a trench isolation layer without using an individual trench isolation layer for each MOS capacitor.

As shown in FIG. 18, the rate of B mode failures, caused by breakdowns at lower voltage levels, goes down significantly, and the distribution of the capacitor insulating film breakdown voltage levels shifts toward a higher level, when the ONO film is used, instead of the thermal oxide film, as the capacitor insulating film of the SOI substrate MOS capacitor. However, the mean time to TDDB failures, determined by random failures, cannot be effectively improved without using the ONO film 38 for the MOS capacitor in the SOI semiconductor device 36 in FIG. 32F.

Compared with a thermal oxide film created by thermal oxidation of a surface of a regular silicon substrate, a thermal oxide film created by thermal oxidation of a surface of a silicon semiconductor layer on an SOI substrate is susceptible to defects at the surface of the silicon semiconductor layer, which are not gettered effectively because of the buried insulating film. As a result, the thermal oxide film at the surface of the silicon semiconductor layer is affected by the defects at the surface of the silicon semiconductor layer and is likely to include more traps of larger sizes compared with the thermal oxide film on silicon.

The lower layer oxide film 38a, which is a part of the ONO film 38 and is most affected by the defects at the surface of the silicon semiconductor layer on the SOI substrate in the MOS capacitor in the SOI semiconductor device 36 in FIG. 2F, is thick enough to suppress the effects of traps in the thermal oxide film and prevent a degradation in mean time to TDDB failure, caused by random failures. Furthermore, the thickness of the silicon nitride film 38b in the ONO film 38 is greater than or equal to 40 nm and more preferably 50 nm, so that the ONO film 38 would achieve a high breakdown voltage and long mean time to TDDB failure. When the silicon nitride film 38b in the ONO film 38 is greater than or equal to 40 nm and more preferably greater than or equal to 50 nm in thickness, the traps inside the lower layer oxide film 38a are adequately terminated by hydrogen atoms in the silicon nitride film 38b, as the silicon nitride film 38b is deposited, to prevent a degradation in mean time to TDDB failure, caused by random failures.

Figure 5:
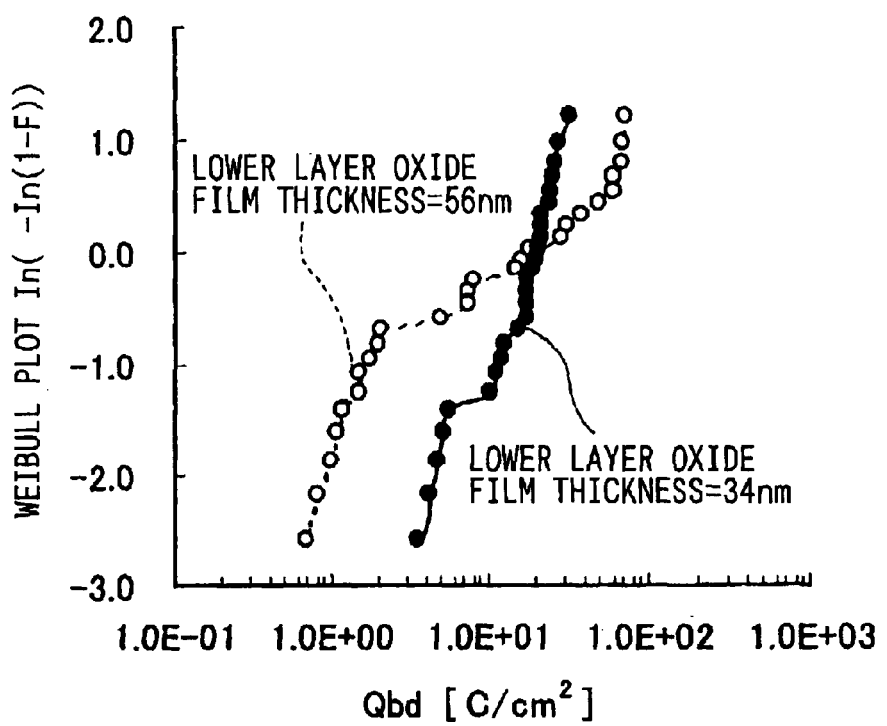
FIG. 5 is a graph showing the constant current TDDB characteristics being dependent on the thickness of the lower layer oxide film in the MOS capacitors with a 1.0 mm$^2$ surface area on the SOI substrates.
Figure 6:
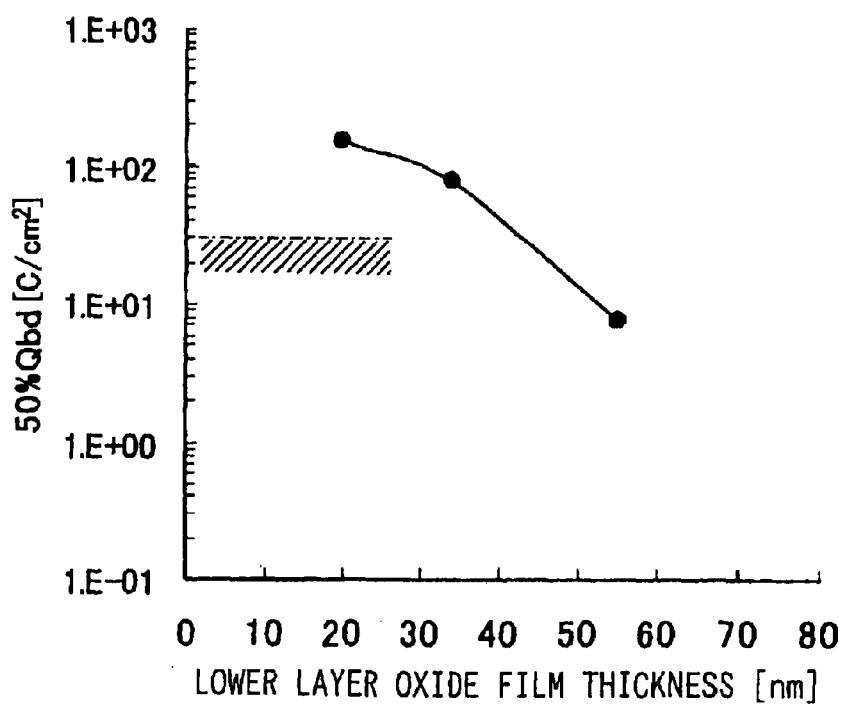
FIG. 6 is a graph showing the total injected charge to breakdown being dependent on the thickness of the lower layer oxide film in the ONO films.

When the ONO film is used instead of the thermal oxide film for the capacitor insulating layer in the trench isolation layer SOI substrate MOS capacitor, as in the MOS capacitor in the SOI semiconductor device 36 in FIG. 2F, a high rate of failures caused by traps in the oxide film is observed with the lower layer oxide film 38a being thick at 56 nm, as shown in FIG. 5. Furthermore, as shown in FIG. 6, the thicker the lower layer oxide film 38a in the ONO film 38, the lower are the total injected charges to breakdown for achieving a 50% cumulative failure rate, or the 50% Qbd value.

Therefore, by making the thickness of the lower layer oxide film 38a in the ONO film 38 less than or equal to 50 nm, or more preferably, less than or equal to 40 nm, or even more preferably, less than or equal to 35 nm, it is possible to reduce the rate of random failures in the MOS capacitor and make the mean time to TDDB failure longer. By the way, the upper limit value for the thickness of the lower layer oxide film 38a should be set based on target parameters. For example, if the acceptable 50% Qbd value were greater than or equal to 30 C/cm$^2$, then the upper limit value for the thickness of the lower layer oxide film 38a should be 40 nm.

Figure 7:
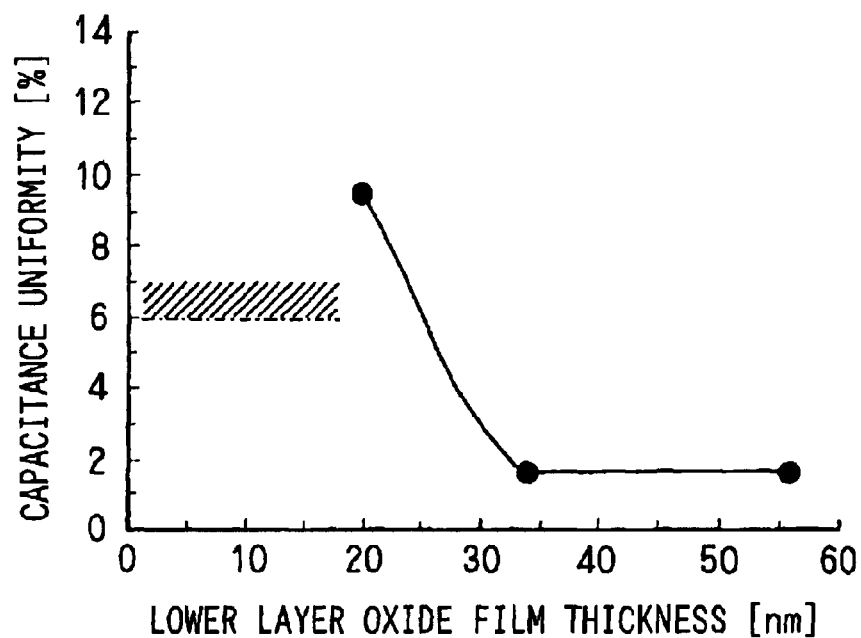
FIG. 7 is a graph showing the capacitance uniformity being dependent on the thickness of the lower layer oxide film in the MOS capacitors.

As shown in FIG. 7, the thinner the lower layer oxide film 38a is in the ONO film 38, the more non-uniform would be the capacitance of the MOS capacitor 37, which includes the ONO film 38 and located on the SOI substrate 11, because of the conditions of the silicon/oxide film interface. Therefore, if the maximum allowed capacitance non-uniformity is less than or equal to 5–6%, then the thickness of the lower oxide film 38a in the ONO film 38 must be greater than or equal to 25 nm.

Figure 8:
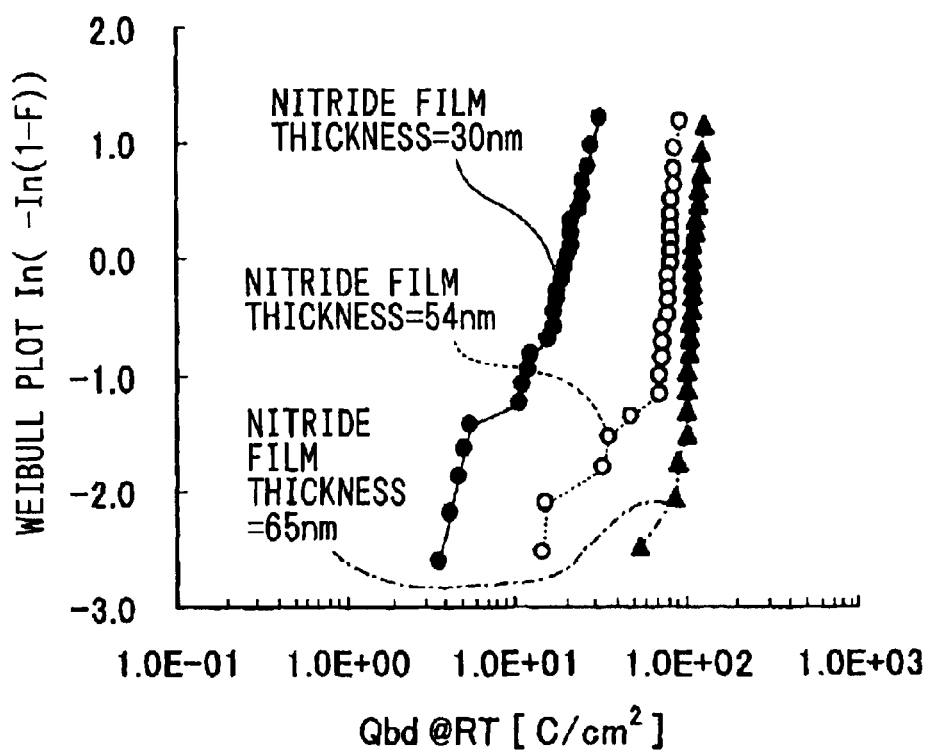
FIG. 8 is a graph showing the constant current TDDB characteristics being dependent on the thickness of the nitride film in the MOS capacitors that are 1.0 mm$^2$ in size and formed on SOI substrates.
Figure 9:
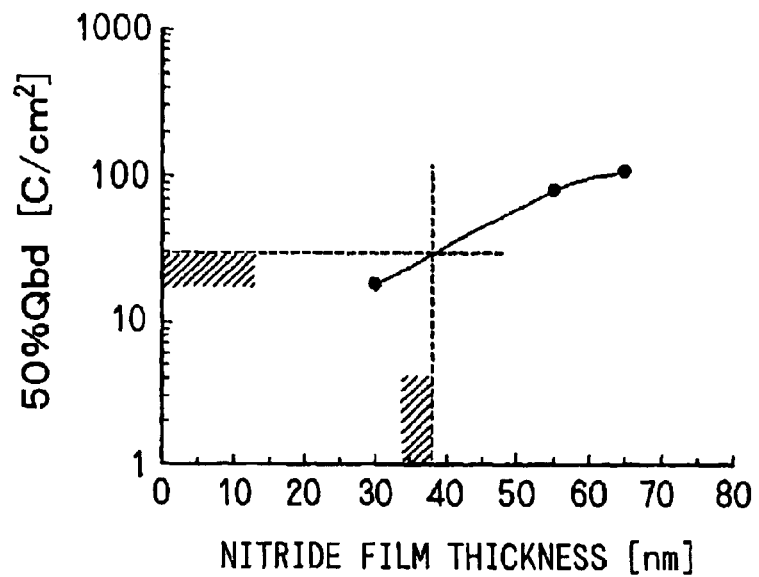
FIG. 9 is a graph showing the total injected charges to breakdown in the ONO film being dependent on the thickness of the silicon nitride films.

As shown in FIG. 8 and FIG. 9, when the silicon nitride film 38b in the ONO film 38 is as thin as 30 nm, a high rate of random failures is observed. For this reason, the silicon nitride film 38b in the ONO film 38 on the SOI substrate 11 should be made as thick as possible. The thickness of the silicon nitride film 38b should be determined based on target parameters. For example, if the 50% Qdb value must be greater than or equal to 30 C/cm$^2$, then the thickness of the silicon nitride film 38b should be greater than or equal to 40 nm or, more preferably, greater than or equal to 50 nm.

Figure 10:
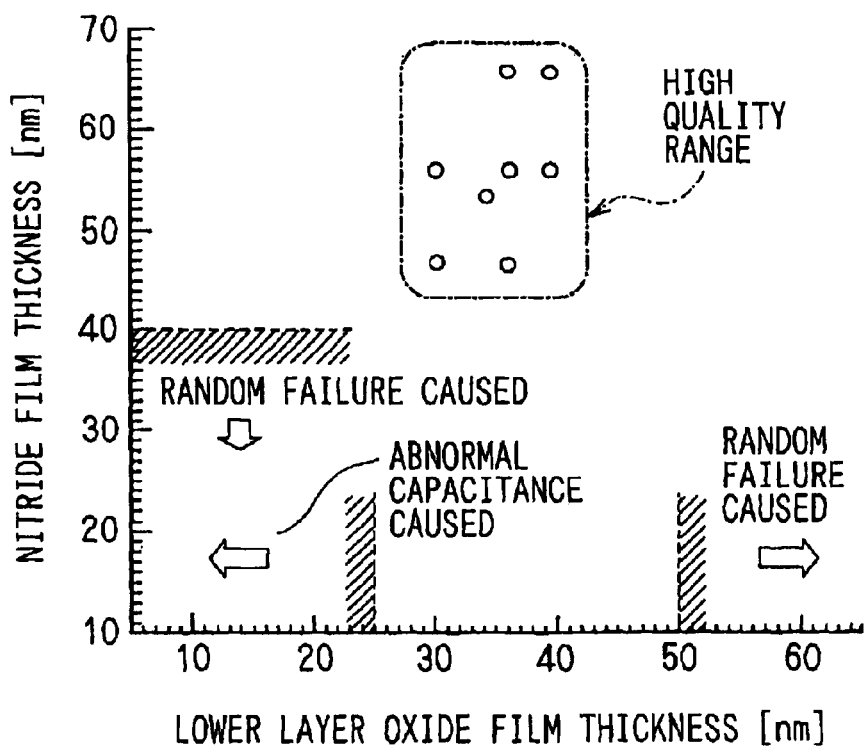
FIG. 10 is a graph showing the optimal conditions for the lower layer oxide film and the silicon nitride film in the ONO film.

The ONO film that includes films the thickness of which are falling within the high quality range shown in FIG. 10 offers high breakdown voltage levels and long mean time to TDDB failure, even when formed on the SOI substrate. The SOI semiconductor device using such an ONO film for the capacitor insulating layer in the MOS capacitor offers a relatively higher reliability.

When this particular ONO film is used for the capacitor insulating film in the MOS capacitor of the SOI semiconductor device in which the combined thickness of the silicon semiconductor layers 11c, 11d of the SOI substrate 11 is a greater than or equal to 10 μm, the relative reliability of the resulting SOI semiconductor device would be especially high.

Figure 11:
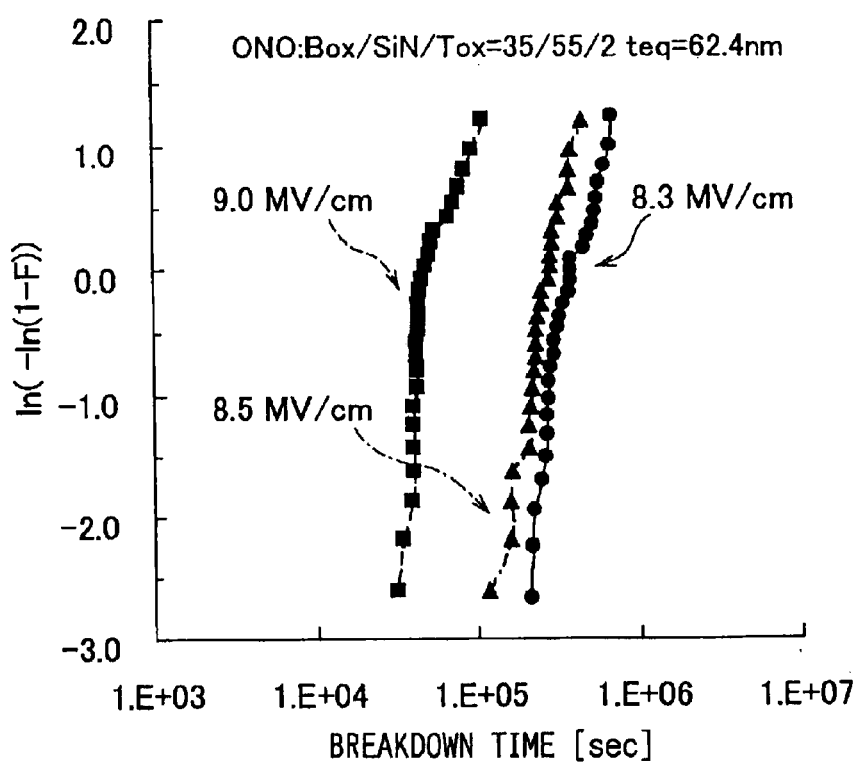
FIG. 11 is a graph showing the constant current TDDB characteristics being dependent on the magnitude of the bias field on the MOS capacitors.
Figure 12:
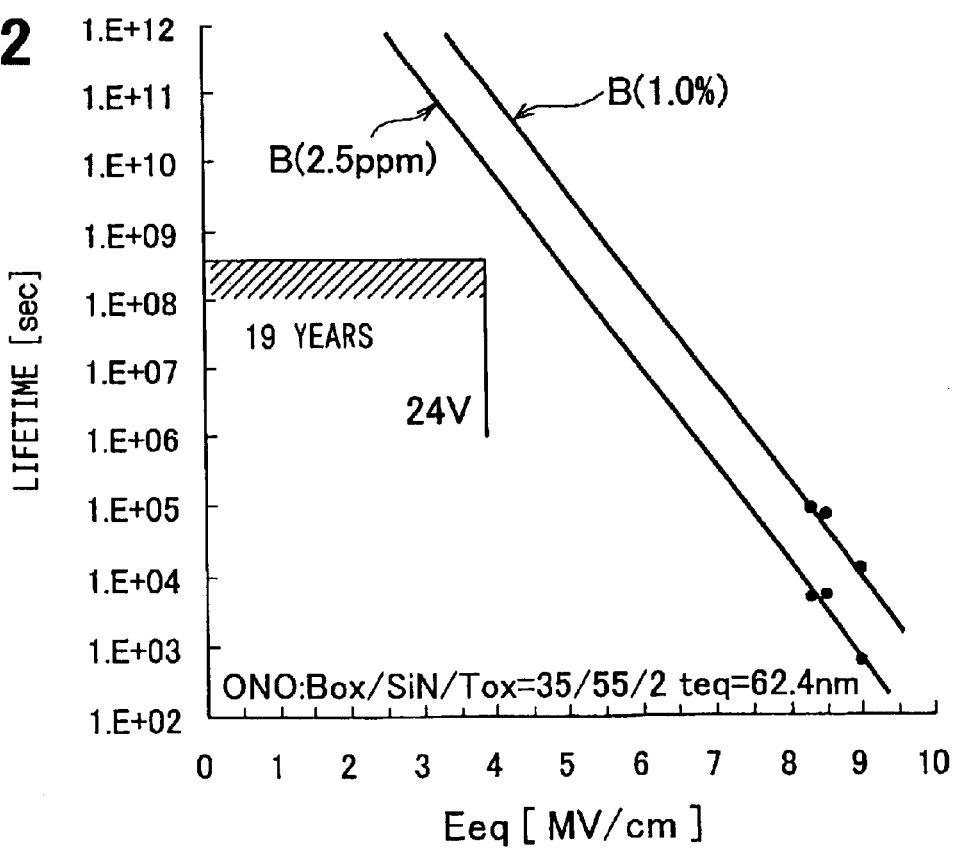
FIG. 12 is a graph showing a relationship between the MOS capacitor mean time to failure and the magnitude of the electrical field through a 1.0% and 2.5 ppm cumulative failure rate.

The mean time to failure under constant TDDB testing conditions was measured at 150° C. with the MOS capacitor that is on the SOI substrate and the combined film thickness of which falls within the high quality range, shown in FIG. 10. More particularly, the lower layer oxide film is 35 nm thick, the silicon nitride film is 55 nm thick, and the upper layer oxide film is 2 nm thick. During the measurement, electrical fields, the magnitudes of which were 8.3 MV/cm, 8.5 MV/cm, and 9.0 MV/cm, were applied on the MOS capacitor. As shown in FIG. 11 and FIG. 12, by using the ONO film, the combined film thickness of which falls within the high quality range, the rate of random failures in the MOS capacitor that includes the ONO film is reduced, and the mean time to TDDB failure in the MOS capacitor becomes relatively longer. For example, the resulting MOS capacitor would survive for greater than or equal to 19 years under a 24 V bias voltage.

Figure 13:
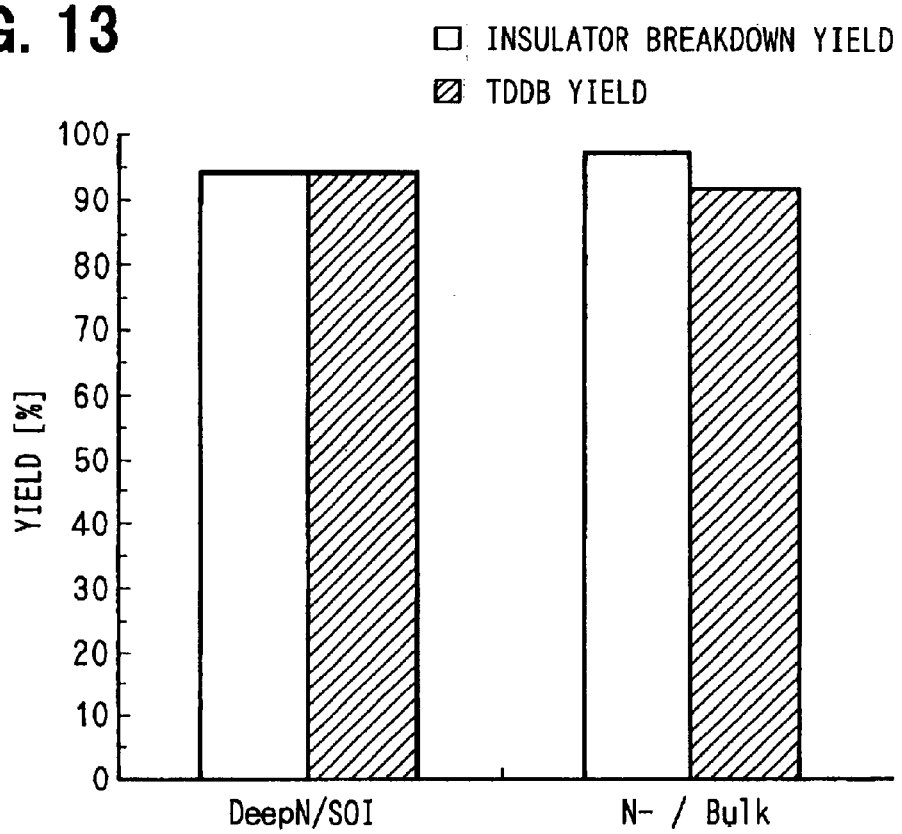
FIG. 13 is a graph showing the values for insulating breakdown yields and TDDB yields for the SOI semiconductor devices, shown in FIG. 2F and FIG. 3F, and semiconductor devices manufactured with silicon substrates as reference samples.
Figure 14:
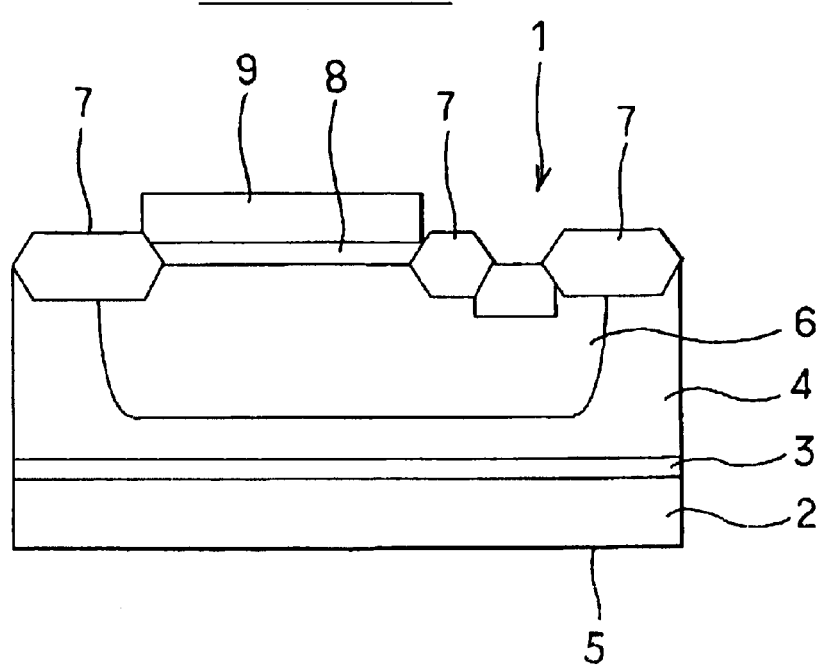
FIG. 14 is a cross-sectional diagram showing an MOS capacitor on an SOI substrate.
Figure 15:
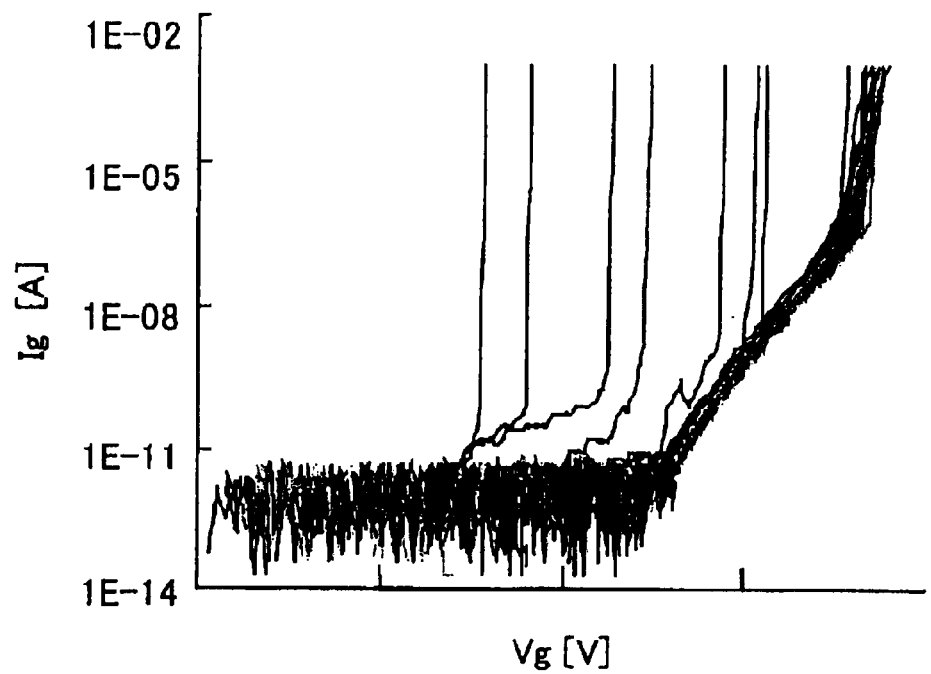
FIG. 15 is a graph showing the I–V characteristics of a multitude of MOS capacitors, having a capacitor insulating film that is an oxide film, on an SOI substrate.
Figure 16:
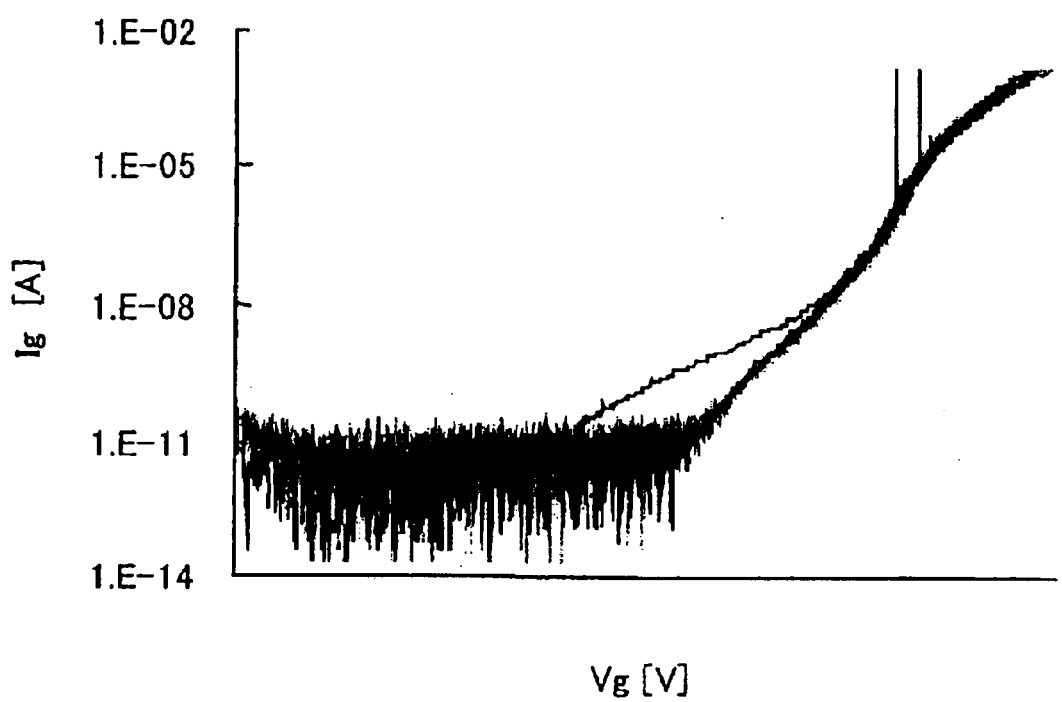
FIG. 16 is a graph showing the I–V characteristics of a multitude of MOS capacitors, the capacitor insulating film of which is an ONO film, on an SOI substrate.
Figure 17:
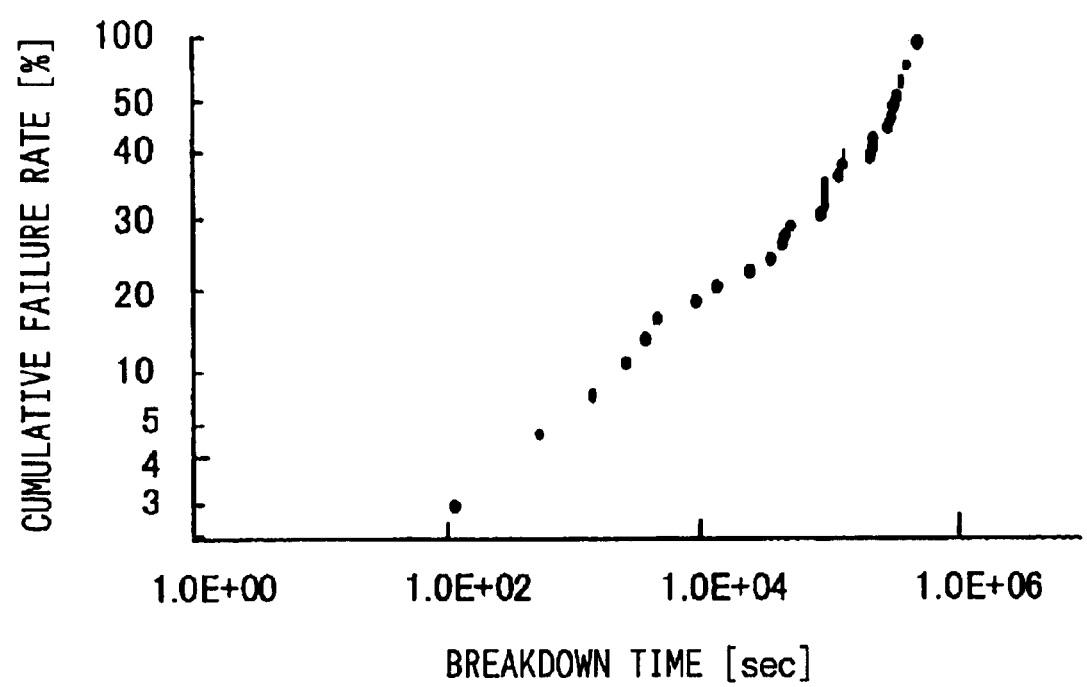
FIG. 17 is a graph showing the constant-voltage TDDB characteristics of MOS capacitors, the capacitor insulating film of which is an ONO film, on an SOI substrate.

FIG. 13 shows the I–V characterization measurement results for the MOS capacitor 37, which has a surface area of 1.0 mm² and is included in the SOI semiconductor device 36 in FIG. 2F and FIG. 3F. FIG. 13 includes data on the insulator breakdown yields, which show a percentage of survival under the true breakdown voltage conditions, and the TDDB yields, which show the percentage of survival under TDDB conditions. The buried diffusion layer 19, which functions as one of the capacitor electrodes in the MOS capacitor 37, has a surface impurity concentration level of 1E19 atoms/cm³. The MOS capacitor 37 is represented as DeepN/SOI in FIG. 13.

For comparison, FIG. 13 also includes the insulator breakdown yield data and the TDDB yield data for an ideal MOS capacitor, which includes an ONO film that is formed under the same conditions as the ONO film in the MOS capacitor 37 as a gate insulating film on a silicon substrate. The MOS capacitor for comparison is represented as N-/Bulk in FIG. 13.

As FIG. 13 shows, both capacitors show almost identical characteristics. The MOS capacitor 37 in the SOI semiconductor device 36 in FIG. 2F and FIG. 3F achieves the insulator breakdown yields and the TDDB yields comparable to the ideal MOS capacitor designed to achieve the best results.

In other words, the MOS capacitor 37 in the SOI semiconductor device 36 in FIG. 2F and FIG. 3F includes the ONO film 38, which offers a relatively high quality for the capacitor insulating film. For this reason, the SOI semiconductor device 36 in FIG. 2F and FIG. 3F shows improvements in terms of the random failures and the infant mortalities caused by the mode B failures, which are problems specific to the SOI substrate 11, while achieving all of the advantages of improved electrical characteristics of using the SOI substrate 11.

Other Embodiments

The present invention is not limited to the SOI semiconductor device 12 in FIG. 1I or the SOI semiconductor device 36 in FIG. 2F and FIG. 3F. The following variation or expansions are possible.

In the SOI semiconductor device 12 in FIG. 1I and the SOI semiconductor device 36 in FIG. 2F and FIG. 3F, the trench isolation layers 17, having a coefficient of thermal expansion that is different from those of the silicon semiconductor layers 11c, 11d, include the thick oxide films 17a and the polysilicon 17b in the trenches 35. The trench isolation layers 17, instead, may also include a single material or different types of materials. Furthermore, while the SOI semiconductor device 12 in FIG. 1I and the SOI semiconductor device 36 in FIG. 2F and FIG. 3F were manufactured by first forming the trenches 35 in the SOI substrate 11 and then forming the thick oxide films 17a and the polysilicon 17b, it is also possible to use an SOI substrate with the trench isolation layers formed and buried in advance.

While the ONO film 38 in the SOI semiconductor device 36 in FIG. 2F and FIG. 3F is used only for the MOS capacitor 37, it is also possible to use the ONO film 38 for the gate insulating film for the other MOS devices, including the CMOS devices 14a, 14b and the LDMOS device 15. In that instance, the ONO film 38 helps improve the reliability of the gate insulating film in the MOS devices.

When the combined thickness of the silicon semiconductor layers 11c, 11d is greater than or equal to 10 μm, the SOI substrate becomes more susceptible to the bimetal effect. Therefore, the present invention would be especially effective when the combined thickness of the silicon semiconductor layers 11c, 11d is greater than or equal to 10 μm in the SOI semiconductor device 36 in FIG. 2F and FIG. 3F and the SOI semiconductor device 12 in FIG. 1I, although the combined total thickness of the silicon semiconductor layers 11c, 11d can be less than 10 μm.

While the SOI semiconductor device 12 in FIG. 1I and the SOI semiconductor device 36 in FIG. 2F and FIG. 3F include the CMOS devices 14a, 14b, the LDMOS device 15, and the bipolar transistor 16, in addition to the MOS capacitor 13, not all of these devices need to be included. The present invention is applicable on SOI semiconductor devices that include at least one MOS capacitor and manufactured using SOI substrates.

Furthermore, the present invention may be used on all types of SOI semiconductor devices manufactured by forming a capacitor insulating film or a gate insulating film, followed by thermal treatments.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An SOI semiconductor device comprising:
    an SOI substrate, which includes a supporting substrate, a buried oxide film, and a silicon semiconductor layer;
    an MOS capacitor, which is located in the silicon semiconductor layer and includes a buried layer that functions as one of a pair of capacitor electrodes, a capacitor insulating layer located on top of the buried layer, and an upper layer electrode that is located on top of the capacitor insulating layer and functions as the other capacitor electrode; and
    a trench isolation layer, which has a coefficient of thermal expansion that is different from that of the semiconductor layer, extends from a surface of the silicon semiconductor layer to the buried oxide film, and surrounds the MOS capacitor for isolating and insulating the MOS capacitor.

2. The semiconductor device in claim 1, wherein the trench isolation layer includes a polysilicon layer and a pair of insulating layers, each of which is located on a surface of the polysilicon layer, and wherein a combined thickness of the insulating layers is greater than or equal to one third of a width of the trench isolation layer.

3. An SOI semiconductor device comprising:
an SOI substrate, which includes a supporting substrate, a buried oxide film, and a silicon semiconductor layer;
and an MOS capacitor, which includes a buried layer that is located in the silicon semiconductor layer and functions as one of a pair of capacitor electrodes, a capacitor insulating layer located on the buried layer, and an upper layer electrode that is located on the insulating layer and functions as the other capacitor electrode;
wherein the capacitor insulating film of the MOS capacitor is an ONO film that includes a lower layer oxide film in contact with the buried layer, a silicon nitride film on the oxide film, and an upper layer oxide film on the silicon nitride film and wherein a thickness of the lower layer oxide film is less than or equal to 50 nm.

4. The semiconductor device in claim 3, wherein the thickness of the lower layer oxide film in the ONO film is greater than or equal to 25 nm.

5. The semiconductor device in claim 3, wherein a thickness of the silicon nitride film is greater than or equal to 40 nm in the ONO film.

6. The semiconductor device in claim 4, wherein a thickness of the silicon nitride film in the ONO film is greater than or equal to 40 nm.

7. The semiconductor device in claim 3 further comprises a trench isolation layer, which surrounds the MOS capacitor in order to insulate and isolate the MOS capacitor, extends from a surface of the silicon semiconductor layer to the buried oxide film, and has a coefficient of thermal expansion that is different from that of the silicon semiconductor layer.

8. The semiconductor device in claim 7, wherein the trench isolation layer includes a polysilicon layer and a pair of insulating layers, each of which is located on a surface of the polysilicon layer, and wherein a combined thickness of the insulating layers is greater than or equal to one third of a width of the trench isolation layer.

9. The semiconductor device in claim 4 further comprises a trench isolation layer, which surrounds the MOS capacitor in order to insulate and isolate the MOS capacitor, extends from a surface of the silicon semiconductor layer to the buried oxide film, and has a coefficient of thermal expansion that is different from that of the silicon semiconductor layer.

10. The semiconductor device in claim 9, wherein the trench isolation layer includes a polysilicon layer and a pair of insulating layers, each of which is located on a surface of the polysilicon layer, and wherein a combined thickness of the insulating layers is greater than or equal to one third of a width of the trench isolation layer.

11. The semiconductor device in claim 5 further comprises a trench isolation layer, which surrounds the MOS capacitor in order to insulate and isolate the MOS capacitor, extends from a surface of the silicon semiconductor layer to the buried oxide film, and has a coefficient of thermal expansion that is different from that of the silicon semiconductor layer.

12. The semiconductor device in claim 11, wherein the trench isolation layer includes a polysilicon layer and a pair of insulating layers, each of which is located on a surface of the polysilicon layer, and wherein a combined thickness of the insulating layers is greater than or equal to one third of a width of the trench isolation layer.

13. The semiconductor device in claim 6 further comprises a trench isolation layer, which surrounds the MOS capacitor in order to insulate and isolate the MOS capacitor, extends from a surface of the silicon semiconductor layer to the buried oxide film, and has a coefficient of thermal expansion that is different from that of the silicon semiconductor layer.

14. The semiconductor device in claim 13, wherein the trench isolation layer includes a polysilicon layer and a pair of insulating layers, each of which is located on a surface of the polysilicon layer, and wherein a combined thickness of the insulating layers is greater than or equal to one third of a width of the trench isolation layer.

15. The semiconductor device in claim 1, wherein a thickness of the silicon semiconductor layer of the SOI substrate is greater than or equal to 10 $\mu$m.

16. The semiconductor device in claim 3, wherein a thickness of the silicon semiconductor layer of the SOI substrate is greater than or equal to 10 $\mu$m.

17. The semiconductor device in claim 1, wherein a surface impurity concentration level of the buried layer of the MOS capacitor is greater than or equal to 1E18 atoms/cm$^3$.

18. The semiconductor device in claim 3, wherein a surface impurity concentration level of the buried layer of the MOS capacitor is greater than or equal to 1E18 atoms/cm$^3$.

19. A method for manufacturing an SOI semiconductor device, the method comprising steps of:
forming an MOS capacitor on an SOI substrate that includes a supporting substrate, a buried oxide film, and a silicon semiconductor layer;
forming a trench isolation layer that surrounds the MOS capacitor in order to insulate and isolate the MOS capacitor;
wherein the step for forming the trench isolation layer includes steps of:
forming a trench that extends from a surface of the silicon semiconductor layer to the buried insulating layer; and
filling the trench with a material having a coefficient of thermal expansion that is different from that of the silicon semiconductor layer.

20. The method in claim 19 wherein the step for forming the trench includes steps of:
dry etching a predetermined area on the silicon semiconductor layer; and
curing or removing a layer damaged by dry etching, and wherein the step for filling the trench with a material having a coefficient of thermal expansion that is different from that of the silicon semiconductor layer includes steps of:
forming an insulating layer on each of a pair of sidewalls that defines a trench such that a combined thickness of the insulating layers is greater than or equal to one third of a width of the trench; and
filling a remaining space in the trench with polysilicon.

21. A method for manufacturing a semiconductor device having an SOI structure, the method comprising steps of forming an MOS capacitor on an SOI substrate, which includes a supporting substrate, a buried oxide film, and a silicon semiconductor layer, wherein the step for forming the MOS capacitor includes steps of
forming a buried layer, which functions as one of a pair of capacitor electrodes;
forming an ONO film, which functions as a capacitor insulating layer; and
forming an upper layer electrode, which functions as the other capacitor electrode, wherein the step for forming the ONO film includes steps of:

forming a lower layer oxide film to have a thickness less than or equal to 50 nm;

forming a silicon nitride film; and forming an upper layer oxide film.

22. The method in claim 21, wherein the lower layer oxide film is formed to have a thickness greater than or equal to 25 nm.

23. The method in claim 21, wherein the silicon nitride film is formed to have a thickness greater than or equal to 40 nm.

24. The method in claim 21, wherein the silicon nitride film is formed to have a thickness greater than or equal to 50 nm.

25. The method in claim 21, wherein the semiconductor device having the SOI structure includes another MOS device and wherein the upper layer oxide film is formed simultaneously with a gate insulating film for the another MOS device.

26. The method in claim 21 further comprising steps of:

forming a trench isolation layer that surrounds the MOS capacitor in order to insulate and isolate the MOS capacitor;

wherein the step for forming the trench isolation layer includes steps of:

forming a trench that extends from a surface of the silicon semiconductor layer to the buried insulating layer; and filling the trench with a material having a coefficient of thermal expansion that is different from that of the silicon semiconductor layer.

27. The method in claim 26, wherein the ONO film is formed after the trench isolation layer is formed.

28. The method in claim 19, wherein the silicon semiconductor layer of the SOI substrate is formed to have a thickness greater than or equal to 10 µm.

29. The method in claim 21, wherein the silicon semiconductor layer of the SOI substrate is formed to have a thickness greater than or equal to 10 µm.

30. The method in claim 19, wherein the step for forming the MOS capacitor includes steps of:

forming a buried layer, which functions as one of a pair of capacitor electrodes and has a surface impurity concentration level greater than or equal to 1E18 atoms/cm$^3$;

forming a capacitor insulating layer; and forming an upper layer electrode, which functions as the other capacitor electrode.

31. The method in claim 21, wherein the buried layer is formed to have a surface impurity concentration level greater than or equal to 1E18 atoms/cm$^3$.

* * * * *